United States Patent [19]

Fukuzawa et al.

[11] Patent Number: 4,748,132

[45] Date of Patent: May 31, 1988

[54] MICRO FABRICATION PROCESS FOR SEMICONDUCTOR STRUCTURE USING COHERENT ELECTRON BEAMS

[75] Inventors: Tadashi Fukuzawa, Tokyo; Akira Tonomura, Koganei; Naoki Chinone, Chofu, all of Japan

[73] Assignee: Hitachi, Ltd., Tokyo, Japan

[21] Appl. No.: 941,841

[22] Filed: Dec. 15, 1986

[30] Foreign Application Priority Data

Dec. 16, 1985 [JP] Japan .................................. 60-280934

[51] Int. Cl.$^4$ ....................... G03C 5/00; H01L 21/203
[52] U.S. Cl. ...................................... 437/25; 437/176;
437/129; 437/173; 437/203; 437/229; 437/245;
437/928; 430/1; 430/329; 250/492.3;
148/DIG. 46; 148/DIG. 72; 148/DIG. 137
[58] Field of Search .......................... 29/578, 572, 571;
148/DIG. 142; 204/192.1, 192.33, 192.34;
358/2; 430/942; 356/347, 348; 250/427

[56] References Cited

U.S. PATENT DOCUMENTS

| | | | |
|---|---|---|---|
| 3,659,947 | 5/1972 | Neumann | 356/106 |
| 3,672,776 | 6/1972 | Brooks | 356/347 |
| 3,929,527 | 12/1975 | Chang et al. | 156/610 |
| 4,377,437 | 3/1983 | Taylor et al. | 156/628 |
| 4,517,280 | 5/1985 | Okamoto et al. | 430/321 |
| 4,575,924 | 3/1986 | Reed et al. | 437/107 |
| 4,612,072 | 9/1986 | Morrison et al. | 156/612 |
| 4,622,114 | 11/1986 | Glass et al. | 204/129.3 |
| 4,634,645 | 1/1987 | Matsuda et al. | 430/317 |

OTHER PUBLICATIONS

Elliott, Integrated Circuit Fabrication Technology, McGraw-Hill Book Co., New York, N.Y., 1983, pp. 372-383.
Asada et al., "Gain and the Threshold of Three-Dimensional Quantum-Box Lasers", IEEE J. Quantum Electronics, vol. QE-22, No. 9, pp. 1915-1921.
Ohtoshi et al., "Calculated Threshold Current Density of Multi-Quantum-Well Wire Lasers," Jap. J. Appl. Phys., vol. 26, No. 2, Feb. 1987, pp. 236-238.
Kawai et al., "Photoluminescence of AlGaAs/GaAs Quantum Wells Grown by Metalorganic Chemical Vapor Deposition", J. Appl. Phys. 56(2), 15 Jul. 1984, pp. 463-467.
Petroff et al., Toward Quantum Well Wires: Fabrication and Optical Properties," Appl. Phys. Lett. 41(7), 1 Oct. 1982, pp. 635-638.
Craighead et al., "10-nm Linewidth Electron Beam Lithography on GaAs", Appl. Phys. Lett. 42(1), 1 Jan. 1983, pp. 38-40.
Arakawa et al., "Multidimensional Quantum Well Laser ...", Appl. Phys. Lett. 40(11), 1 Jun. 1982, pp. 939-941.

Primary Examiner—Brian E. Hearn
Assistant Examiner—William Bunch
Attorney, Agent, or Firm—Antonelli, Terry & Wands

[57] ABSTRACT

As a process for fabricating uniform patterns fine enough to produce a quantum size effect, the use of electron halography is proposed. Disclosed examples employing a process are methods of manufacturing a semiconductors laser whose threshold current is approximately 1 mA, and a permeable transistor and bistable device whose response rates are 100 GHz.

26 Claims, 4 Drawing Sheets

MICRO FABRICATION PROCESS FOR SEMICONDUCTOR STRUCTURE USING COHERENT ELECTRON BEAMS

BACKGROUND OF THE INVENTION

The present invention relates to a semiconductor structure, and more particularly to a micro fabrication process for a semiconductor structure having novel characteristics which are not attained with prior arts.

It has been theoretically known that semiconductor lasers which exploit the quantum size effect based on a multi-dimensional quantum well structure have characteristics superior to those of conventional quantum well lasers Y. Arakawa and H. Sakaki, Appl. Phys. Lett., Vol. 40, No. 11, (1982) p. 939).

For substantiating this, it has been attempted to photoetch a superlattice and fabricate a quantum wire which is triangular in cross section (P. M. Petroff et al, Appl. Phys. Lett., Vol. 41, October 1982, p. 635).

Besides, a metal wire which is 10 nm wide has been obtained with electron-beam lithography (H. G. Graighead et al, Appl. Phys. Lett., Vol. 42, January 1983, p. 38).

A multiple quantum wire which is ultrafine enough to produce the quantum size effect and the widths, straightness and inter-wire distances of which are uniform is indispensable to novel semiconductor lasers and electronic devices of excellent characteristics. It is accordingly desired to develop a fabrication process which is easy and which is of high reliability.

The prior arts mentioned above do not take industrial production into consideration, and leave it as a problem to establish fabrication technology for the multiple quantum wire having uniform wire widths, straightness and inter-wire distances.

SUMMARY OF THE INVENTION

An object of the present invention is to provide a micro fabrication process for a semiconductor structure having submicron wires which exhibit the uniform specifications as stated above.

The above object is accomplished in such a way that electron holography employing a coherent electron beam is adopted at the electron beam irradiation step of forming a resist pattern in a process for fabricating a semiconductor structure to become a semiconductor device.

More specifically, the present invention consists in that, in order to obtain quantum wires each of which has cross-sectional dimensions of approximately 100 Å $\times$ 100 Å or less, electron-lithographic and electron-holographic technologies and semiconductor process technologies are adopted, and that the mutual diffusion between the group-III elements of a superlattice by ion implantation is utilized, thereby to fabricate a semiconductor structure of submicron construction.

The fabrication process of the present invention will be summarized below:

It comprises the step of forming desired semiconductor films and mask layers with semiconductor processing techniques, the step of forming an electron beam-sensitive resist film on a desired one of the films and the layers with conventional electron lithography, the step of irradiating the resist film with an electron holography pattern based on coherent electron beams, the step of developing the irradiated resist film into a resist pattern with the conventional electron lithography, and the step of processing the semiconductor films and the mask layers by employing the resist pattern as a mask and using ion implantation and etching, thereby to transfer the resist pattern to the semiconductor films and the mask layers. Thus, a semiconductor structure having submicron patterns is fabricated, and a semiconductor laser (refer to FIG. 7) or a transistor (FIG. 9) can be manufactured by attaching an electrode or electrodes to the semiconductor structure. In addition, the active region of the semiconductor laser and the control region of the transistor are of 500 Å or less, not attainable with the prior arts, and produce the quantum size effect, so that in the case of the semiconductor laser, the threshold current can be rendered less than 1/10 of the value of a known device, namely, less than 1 mA, while in the case of the transistor, the operating frequency can be rendered higher than 100 GHz.

In brief, the so-called electron holography employing coherent electron beams contributed to the fabrication of a semiconducror structure having ultrafine patterns which exhibit a very excellent homogeneity and each of which has dimensions not greater than 500 Å. As a result, light can be confined in a direction perpendicular to the growth direction of a semiconductor layer, and it can be defined in a direction parallel to the growth direction of the semiconductor layer by a superlattice structure, thereby to realize quantum wires having a two-dimensional quantum size effect.

Besides, the semiconductor laser having such construction comes to have a very low threshold current.

Owing to the interference of the irradiating electron beams for forming a periodic construction, the periodicity is very good, and since the period can be determined by the cross angle of the electron beams, the periodic construction can be formed in a much shorter time than with a conventional technique of electron beam exposure.

The transistor based on the semiconductor structure of the present invention is ultrafine in construction, and therefore operates at an ultrahigh speed having hitherto been unattainable.

According to the present invention, it is possible to fabricate quantum wires and quantum boxes in which the dimensions of the smallest part of a pattern are 30–500 Å and in which the wire widths, straightness and inter-wire distances of the patterns are uniform. It is therefore possible to manufacture semiconductor lasers, transistors, bistable devices etc. which apply the quantum wires and the quantum boxes and which exhibit high performances hitherto unattainable.

In consequence, the performances of apparatuses applying them are enhanced, and the designs thereof are facilitated. Further, the costs of the apparatuses can be curtailed owing to decrease in the number of components and reduction in the power consumption.

For example, in the case of the semiconductor laser, the threshold current is rendered 1/10 or less, namely, on the order of mA, so that the designs of an optical disk apparatus etc. applying the semiconductor laser are facilitated, and components and electric power for correcting the threshold current are dispensed with, so that the costs are sharply curtailed.

DETAILED DESCRIPTION OF THE PRESENTLY PREFERRED EMBODIMENTS

Example 1

This example will be described with reference to FIGS. 1-6.

Figure 1:
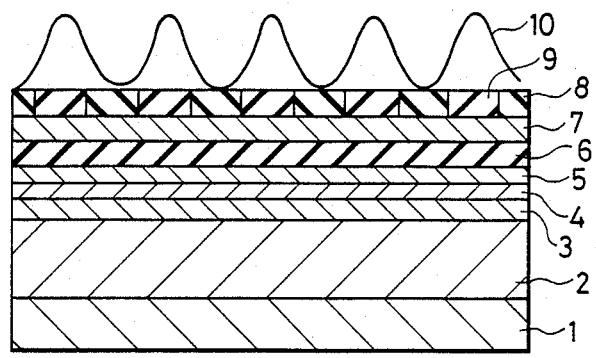
FIGS. 1–4 are sectional views of crystals showing a process in which quantum wires are fabricated by the crystal mixing of a micro heterostructure based on electron holography and ion implantation.
Figure 2:
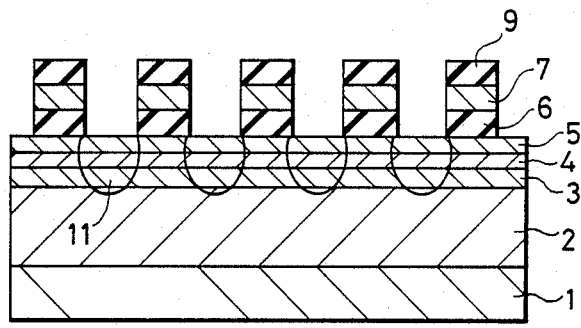

FIG. 1 shows a semiconductor crystal coated with a multilayer resist which was placed in an electron-beam lithography system.

An n-$Ga_{0.5}Al_{0.5}As$ cladding layer 2 (2 $\mu$m thick), an n-$Ga_{0.6}Al_{0.4}As$ barrier layer 3 (100 Å thick), an undoped GaAs quantum well layer (superlattice layer) 4 (100 Å thick) and a p-$Ga_{0.4}Al_{0.6}As$ barrier layer 5 (100 Å thick) were successively grown on an n-GaAs substrate 1 by well-known mollecular beam epitaxy. Thereafter, an electron-beam resist layer 6, a Ge-evaporated thin film 7 (200 Å thick) and an electron-beam resist layer 8 (500 Å thick) were formed by well-known methods. Examples of the method of depositing the resist layers are wheeler coating and spray coating.

Figure 3:
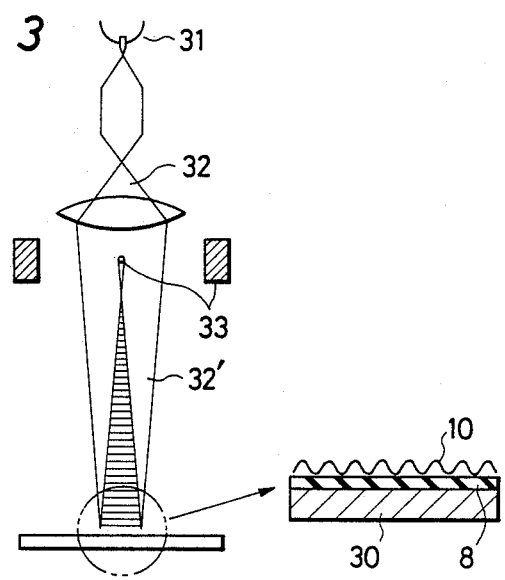

Subsequently, as shown in FIG. 3, beams 32' obtained by dividing a highly coherent electron beam (at an acceleration voltage of 50 keV) 32 emergent from an electron beam source 31, in two by means of a electron biprism 33 were superposedly projected on the semiconductor 30 described above, whereby a stationary wave 10 of electron density distribution could be generated on the resist 8 as illustrated in FIG. 1. Numeral 9 in FIG. 1 denotes those regions of the electron beam resist 8 which were intensely exposed to the electron beam, and the repetition period of the regions was 200 Å.

After being exposed to the electron beam at a current density of $3 \times 10^{-5}$ A/cm$^2$ for 10 seconds, the parts of the resist 8 other than the regions 9 were removed by a development employing a conventional method. Subsequently, plasma etching which employed CF$_4$ was used to etch the Ge layer 7 and to etch the resist layer 6 (refer to FIG. 2). Using the resultant ultrafine pattern of the multilayer resist, Ga ions were implanted at an acceleration voltage of 50 keV so as to form high concentration regions of Ga 11. After removing the layers 6, 7 and 9, a p-$Ga_{0.5}Al_{0.5}As$ cladding layer 14 (2 $\mu$m thick) and a p-GaAs cap layer 15 (0.2 $\mu$m thick) were grown in a molecular-beam epitaxy apparatus, whereupon the resultant structure was annealed at 850° C. in an As atmosphere for 2 hours, to change the layers 3, 4 and 5 within the regions 11 into a mixed crystal by virtue of the impurity induced disordering (refer to FIG. 4).

Figure 6:
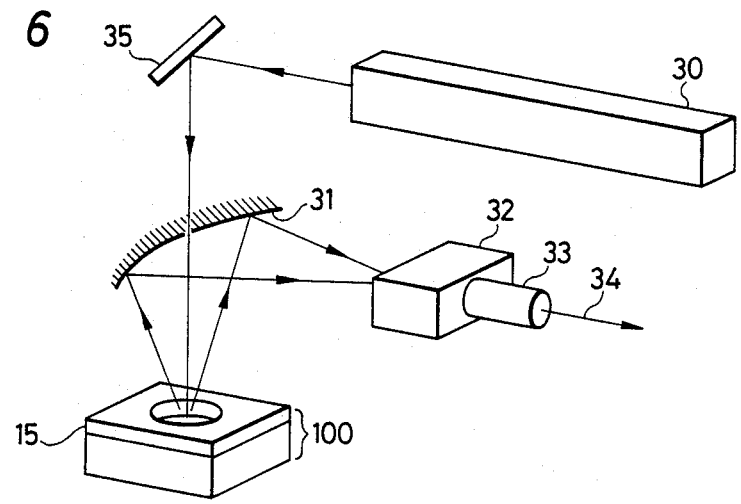
FIG. 6 is a schematic view showing an experiment for verifying the fabrication of the quantum wires.

As a result, the remaining parts of the GaAs layer 4 were buried in the mixed crystal 12 and the layers 3 and 5, the band gaps of which were greater than that of GaAs, by the above operations and became quantum wires 13 each being 100 Å thick and 125 Å wide, whereby the semiconductor structure 100 of the present invention was finished up. Subsequently, as shown in FIG. 6, the cap layer 15 of the structure 100 was partly removed, and the structure was excited with an Ar laser 30 so as to measure a photo luminescence spectrum. In FIG. 6, numeral 31 indicates an apertured parabolic mirror, numeral 32 a monochrometer, numeral 33 a photodetector, numeral 34 an electric signal output, and numeral 35 a reflector. The emission wavelength of the semiconductor structure was 815 nm, which was shorter than the oscillation wavelength 840 Å of a semiconductor laser employing an ordinary unfined superlattice 100 Å thick. Thus, it was verified that the quantum wires were formed.

Example 2

An example in which a semiconductor laser was constructed using the semiconductor structure stated in Example 1 will be described with reference to FIGS. 2, 4, 5 and 7.

Figure 4:
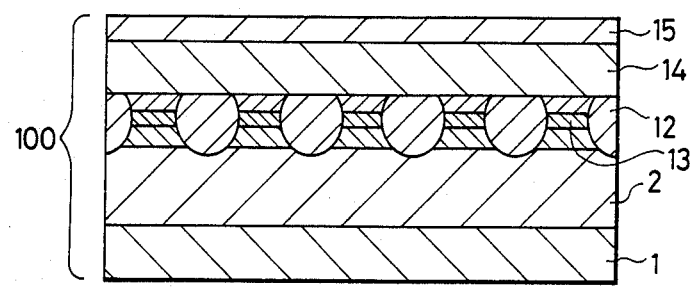
Figure 5:
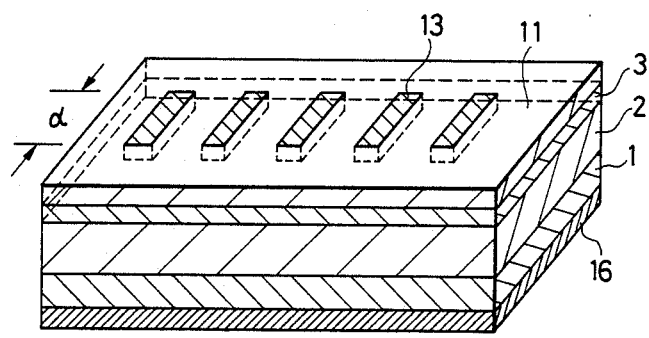
FIG. 5 shows the cut model of a quantum wire laser.
Figure 7:
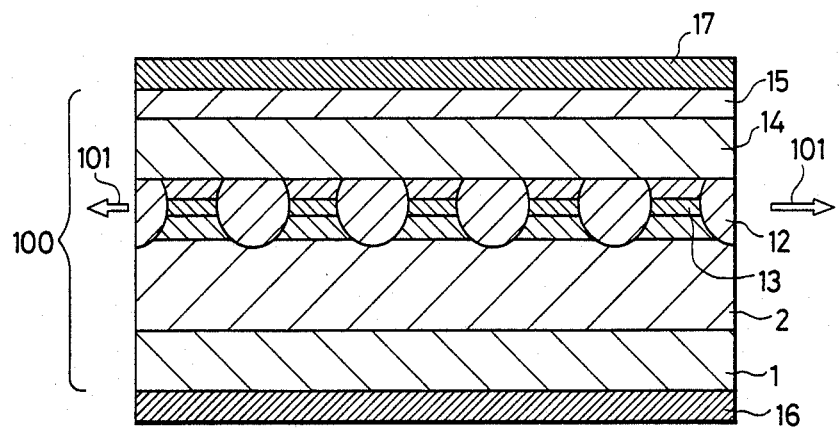
FIG. 7 is a sectional view of a semiconductor laser.

A structure similar to that shown in FIG. 4 was prepared by the same method as in Example 1. The quantum wires numbering 5000 were formed perpendicular to the resonator direction of the laser. A length in a direction perpendicular to the resonator direction of the laser, in other words, the length of the quantum wire was made 1 $\mu$m. This length was determined by such processing that, after the holographic exposure, the portions of the quantum wires were limited to 1 $\mu$m by conventional electron-beam lithography. The section of the crystal parallel to the laser resonator direction was the same as depicted in FIG. 4. Thereafter, as illustrated in FIG. 7, the structure 100 was formed with an n-side electrode 16 and a p-side electrode 17 and was cleaved by conventional methods, whereby the laser device was completed. Numeral 101 indicates the emission direction of laser radiation. FIG. 5 shows the cut model of this laser device in a plane parallel to the quantum wires.

In case of a quantum wire laser having a laser resonator length of 100 $\mu$m and a stripe width of 1 $\mu$m, the oscillating threshold current was 1 mA, and the oscillating wavelength was 810 nm.

Example 3

In Examples 1 and 2, Ga ions were implanted, and the micro-fabrication heterostructure was subjected to the crystal mixing. Here, Si ions were implanted for crystal mixing, thereby to fabricate a quantum wire laser in which the dimensions of quantum wires were 100 Å×200 Å. The characteristics of this laser were a threshold current of 2 mA and an oscillation wavelength of 835 nm.

Example 4

Figure 8:
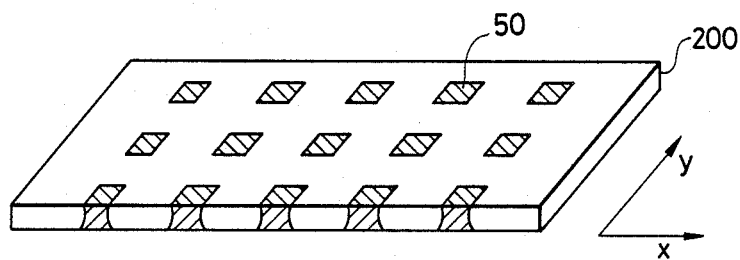
FIG. 8 is a perspective view of a structure which is formed with quantum boxes.

After the end of the electron-beam holographic exposure in Example 1, the sample was rotated by 90° and was again subjected to the holographic exposure employing the electron beams, and it was developed, whereby the resist could be left in the shape of dice each being of 150 Å×150 Å. Thereafter, the crystal was processed by the same methods as in Example 1, thereby to obtain a semiconductor structure 200 having cubic quantum boxes 50, the sides of which were each 100 Å, as shown in FIG. 8.

Figure 10:
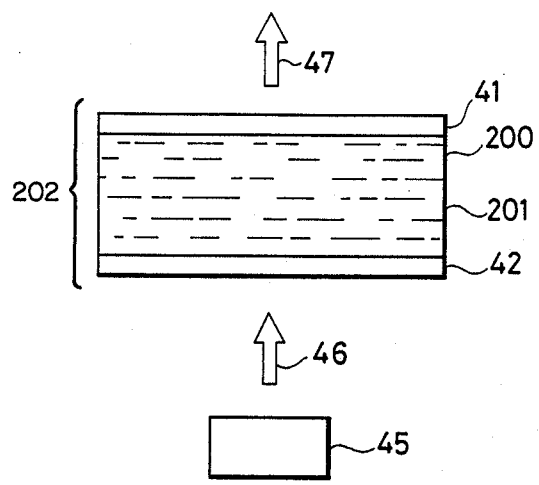
FIGS. 10 and 11 are diagrams for explaining a bistable device in another example.
Figure 11:
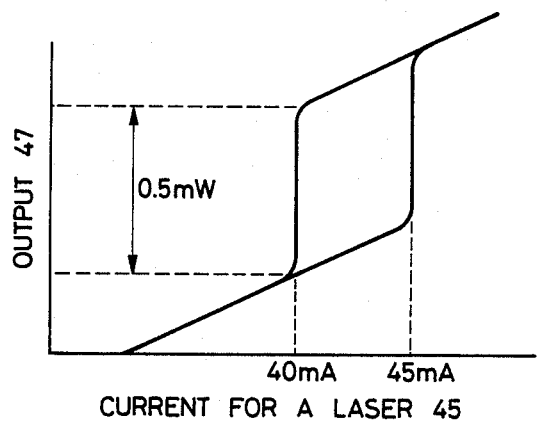

This structure was utilized to manufacture a bistable device. As shown in FIG. 10, the structures 200 each having the quantum boxes were stacked in a multiplicity of layers into a structure 201. Well-known dielectric multilayer films 41 and 42 each consisted of an SiO$_2$ film and an Si₃N₄ film stacked were formed as mirrors (reflection factor: 90%) on the surface of the laminated structure 201. Thus, the bistable device 202 was completed. A beam 46 of a wavelength of 810 nm from a semiconductor laser 45 was irradiated on this device, and the relationship between the input beam and an output beam 47 from the device 202 was investigated. Then, a bistable characteristic as shown in FIG. 11 was exhibited. The response rate of this characteristic was 20 GHz.

Example 5

This example will be described with reference to FIG. 9.

Figure 9:
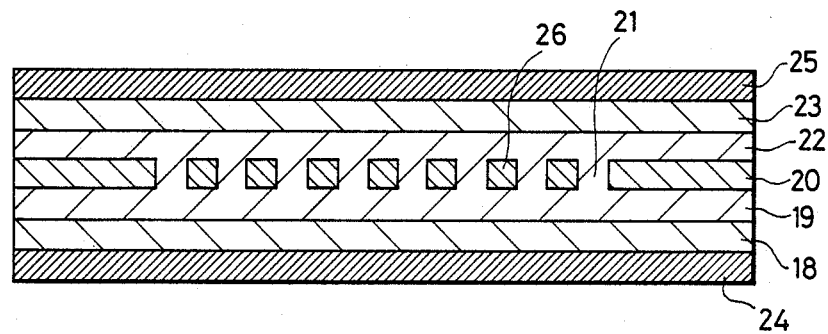
FIG. 9 is a sectional view of a permeable base transistor in an example of the present invention.

Using the micro fabrication process based on the electron holography, a permeable base transistor (PBT) as shown in FIG. 9 was manufactured. After an n-GaAs layer 19 was grown on an n-GaAs crystal substrate 18, a tungsten film 20 was evaporated to a thickness of 300 Å. Thereafter, the tungsten film was coated with an electron-beam resist, an electron-beam resist grating having a period of 500 Å and a width of 300 Å was prepared by electron holography, and window regions 21 were provided in the tungsten layer by dry etching. Thus, quantum wires were formed constituted by the remaining portion of the tungsten layer.

After the resist was removed, an undoped GaAs layer 22 was grown using a MOCVD process so as to fill up the regions 21 lacking in tungsten. Subsequently, an n-GaAs layer 23 was grown, and ohmic electrodes 24 and 25 were formed. The tungsten electrode 20 was connected with the exterior by providing holes in parts of the electrode 25 and the crystals 22, 23 and was used as a control (base) electrode. The current - voltage characteristic of the transistor was a triode characteristic, and the modulation frequency was 100 GHz.

In the examples thus far described, the fluctuations of the periods of the quantum wires were within ±0.2%.

Also quantum wires and quantum boxes whose patterns had period of 30 Å could be fabricated by the same methods as in Example 5, and the fluctuations of the periods were within ±0.4%.

What is claimed is:

1. A micro fabrication process for a semiconductor structure, comprising at least:
   (a) the film formation step of forming necessary ones of various semiconductor films and mask layers on a semiconductor substrate,
   (b) the resist film formation step of forming an electron beam-resist film on any of the film and the layer,
   (c) the irradiation step of irradiating said electron beam-resist film with a pattern based on coherent electron beams,
   (d) the resist pattern formation step of forming the pattern in said resist film, and
   (e) the transfer step of transferring the resist pattern to any of the films and the layer.

2. A micro fabrication process for a semiconductor structure as defined in claim 1, wherein the pattern includes periodic patterns.

3. A micro fabrication process for a semiconductor structure as defined in claim 1, wherein the pattern is a holographic pattern.

4. A micro fabrication process for a semiconductor structure as defined in claim 1, wherein said semiconductor structure constitutes a member selected from the group consisting of a transistor and a semiconductor laser.

5. A micro fabrication process for a semiconductor structure as defined in claim 1, wherein said transfer step is an ion implantation step.

6. A micro fabrication process for a semiconductor structure as defined in claim 1, wherein semiconductor films of said semiconductor structure are made of GaAs and GaAlAs, and said transfer step is a Ga ion implantation step.

7. A micro fabrication process for a semiconductor structure as defined in claim 1, wherein the pattern includes periodic patterns, and one of dimensions of the periodic patterns is 30–500 Å.

8. A micro fabrication process for a semiconductor structure as defined in claim 1, wherein said semiconductor structure constitutes a quantum wire laser.

9. A wire fabrication process for a semiconductor structure as defined in claim 1, wherein said semiconductor structure is a quantum box structure.

10. A micro fabrication process for semiconductor quantum wires comprising the steps of:
    (a) forming, in sequence, on a substrate a semiconductor material cladding layer, a semiconductor material barrier layer, a quantum well layer, and a semiconductor material further barrier layer;
    (b) forming, on said further barrier layer, an electron-beam resist layer;
    (c) irradiating said electron-beam resist layer with a pattern based on coherent electron beams, whereby portions of said resist layer can be selectively removed by developing said resist layer;
    (d) developing said resist layer so as to selectively remove the resist layer to form the pattern;
    (e) using said pattern as a mask, selectively implanting ions so as to extend through said further barrier layer, said quantum well layer and said barrier layer, and into said cladding layer;
    (f) forming a semiconductor material further cladding layer on said further barrier layer, after removal of said pattern; and
    (g) annealing the resulting structure so as to form said barrier and further barrier layers, and said quantum well layer, into a mixed crystal having a remaining part of said quantum well layer buried therein and in remaining portions of said barrier and further barrier layers, said remaining part of said quantum well layer constituting quantum wires.

11. A micro fabrication process as defined in claim 10, wherein said forming an electron-beam resist layer includes forming, in sequence, on said further barrier layer a first electron-beam resist film, a Ge-evaporated thin layer, and a second electron-beam resist film; and wherein said developing said resist layer including removing portions of the second electron-beam film least exposed to the irradiating, and then selectively removing portions of the Ge-evaporated thin layer and first electron-beam resist film so as form said pattern.

12. A micro fabrication process as defined in claim 10, wherein said cladding layer and said barrier layer are made of n-GaAlAs, said quantum well layer is formed of undoped GaAs, and said further barrier and cladding layers are formed of p-GaAlAs.

13. A micro fabrication process as defined in claim 12, wherein said ions selectively implanted using said pattern are Ga ions.

14. A micro fabrication process as defined in claim 10, wherein said irradiating is performed by dividing a highly coherent electron beam so as to irradiate the resist with a stationary wave of electron energy distribution.

15. A micro fabrication process as defined in claim 14, wherein said stationary wave has a repetition period of 200 Å.

16. A micro fabrication process as defined in claim 10, comprising the further step of forming a cap layer on said further cladding layer, prior to said annealing.

17. A micro fabrication process as defined in claim 10, comprising the further steps, after said annealing, of forming n-electrode and p-electrode layers respectively closest to the n- and p-cladding layers, and cleaving the resulting structure having the electrode layers, so as to provide a quantum wire laser.

18. A micro fabrication process as defined in claim 17, wherein, prior to forming the electrode layers and cleaving, the structure having the formed quantum wires is subjected to electron-beam lithography so as to limit the length of the wires to a desired length.

19. A micro fabrication process as defined in claim 18, wherein said ions are Ga ions.

20. A micro fabrication process as defined in claim 18, wherein said ions are Si ions.

21. A micro fabrication process as defined in claim 10, wherein, after said irradiating, the resulting structure is rotated 90° and again subjected to said irradiating, whereby, in said developing, said pattern is formed having the shape of a plurality of dice, with the remaining part of the quantum well layer after said selectively implanting ions and said annealing constituting cubic quantum boxes formed in a semiconductor structure.

22. A micro fabrication process as defined in claim 21, comprising the further steps of forming a plurality of said semiconductor structures having said cubic quantum boxes formed therein and stacking said plurality of said semiconductor structures, so as to form a stacked structure having opposed major sides, and forming mirror layers on said opposed major sides.

23. A micro fabrication process as defined in claim 22, wherein the mirror layers each include dielectric multilayer films of an $SiO_2$ film and an $Si_3N_4$ film.

24. A micro fabrication process for forming a semiconductor structure comprising the steps of:
 (a) forming a layer of semiconductor material on a semiconductor substrate;
 (b) forming a tungsten film on the layer of semiconductor material;
 (c) forming on said tungsten film an electron-beam resist layer;
 (d) irradiating said electron-beam resist layer with a pattern based on coherent electron beams, whereby portions of said resist layer can be selectively removed by developing said resist layer;
 (e) developing said resist layer so as to selectively remove the resist layer to form the pattern, said pattern being an electron-beam resist grating; and
 (f) using said pattern as a mask, etching said tungsten film so as to form windows therein, whereby quantum wires are formed constituted by unetched tungsten film.

25. A micro fabrication process as defined in claim 24, including the further steps, after forming the quantum wires, of:
 (g) removing the pattern of resist;
 (h) forming a further semiconductor layer so as to fill up said windows in said tungsten film;
 (i) forming a still further semiconductor layer on the further semiconductor layer, the resulting laminate having opposed major surfaces; and
 (j) forming respective ohmic electrodes on the opposed major surfaces of the laminate.

26. A micro fabrication process as defined in claim 25, including the further step of forming an electrical connection to said unetched tungsten film, whereby a permeable base transistor is formed, said unetched tungsten film constituting an electrode of said permeable base transistor.

* * * * *